United States Patent
Altmann

(10) Patent No.: US 7,498,889 B2
(45) Date of Patent: Mar. 3, 2009

(54) ANALOG PHASE CONTROLLER

(75) Inventor: Michael Altmann, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/499,028

(22) Filed: Aug. 3, 2006

(65) Prior Publication Data

US 2008/0048787 A1   Feb. 28, 2008

(51) Int. Cl.
   *H03L 7/08* (2006.01)
(52) U.S. Cl. ............................ 331/17; 375/374; 327/5
(58) Field of Classification Search ............... 331/17; 327/2, 3, 5; 375/373–376
   See application file for complete search history.

(56) References Cited

U.S. PATENT DOCUMENTS

| | | | |
|---|---|---|---|
| 6,107,848 A * | 8/2000 | Pickering et al. ............ | 327/146 |
| 6,424,230 B1 | 7/2002 | Kocaman et al. | |
| 6,448,848 B1 | 9/2002 | Altmann | |
| 6,748,027 B1 | 6/2004 | Kocaman et al. | |
| 6,764,891 B2 | 7/2004 | Altmann | |
| 6,849,488 B2 | 2/2005 | Altmann | |
| 6,855,995 B2 | 2/2005 | Altmann | |
| 6,901,126 B1 * | 5/2005 | Gu ............................ | 375/355 |
| 6,911,853 B2 * | 6/2005 | Kizer et al. ................. | 327/158 |
| 6,940,938 B2 | 9/2005 | Altman et al. | |
| 7,197,101 B2 * | 3/2007 | Glenn et al. ................ | 375/373 |
| 7,203,259 B2 | 4/2007 | Glenn et al. | |
| 7,368,955 B2 | 5/2008 | Kiziloglu et al. | |
| 2006/0285618 A1 * | 12/2006 | Shoor ........................ | 375/373 |
| 2008/0002800 A1 | 1/2008 | Altmann | |
| 2008/0048787 A1 | 2/2008 | Altmann | |
| 2008/0080647 A1 | 4/2008 | Altmann et al. | |

* cited by examiner

*Primary Examiner*—Robert Pascal
*Assistant Examiner*—Levi Gannon
(74) *Attorney, Agent, or Firm*—Erik R. Nordstrom

(57) ABSTRACT

Disclosed are embodiments of a phase control circuit with an analog phase controller having first and second order integration. In some embodiments, the analog control circuit generates first and second control signals and controls the first control signal based on the sign of the second control signal and controls the second control signal based on the sign of the first control signal.

21 Claims, 4 Drawing Sheets

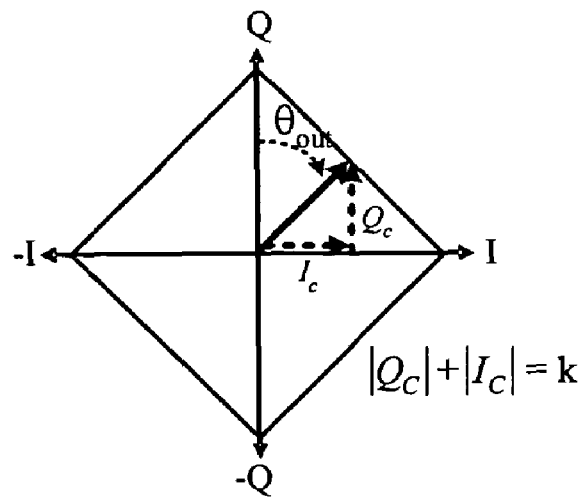
FIGURE 4A
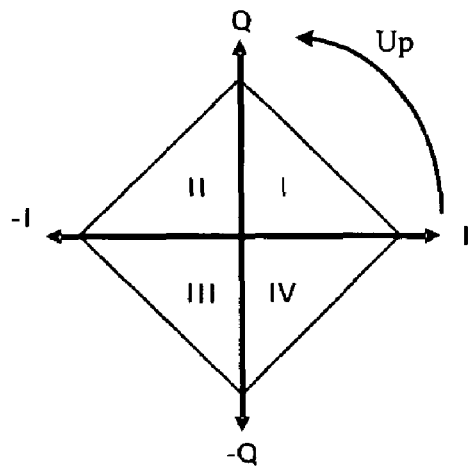
FIGURE 4B
| Quadrant | Up $I_C$ | Up $Q_C$ | Down $I_C$ | Down $Q_C$ |
|---|---|---|---|---|
| I | ↓ | ↑ | ↑ | ↓ |
| II | ↓ | ↓ | ↑ | ↑ |
| III | ↑ | ↓ | ↓ | ↑ |
| IV | ↑ | ↑ | ↓ | ↓ |
FIGURE 4C

ANALOG PHASE CONTROLLER

BACKGROUND

Phase control circuits are used in a variety of applications such as in transceivers to synthesize clock signals or to recover data from a data stream in a clock and data recovery (CDR) application. They typically use a voltage controlled oscillator (VCO) or a phase interpolator (PI) to generate an output signal with a controllable phase angle (or phase).

PI type phase control circuits may be digital or analog. Digital PI-based circuits typically control a phase interpolator with one or more digital words having a fixed number of possible values. They can perform well but may be limited due, for example, to their limited resolution, which can make it difficult to use them in higher frequency applications. On the other hand, analog PI controllers have better phase control resolution but may have other drawbacks such as when a frequency offset exists between PI core reference clocks and the incoming frequency signal to be tracked, there can be a perpetual output phase offset, i.e., a non-zero static phase error. Accordingly, improved phase control solutions are desired.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 4A is a diagram showing the relationship between output phase values and applied control values in accordance with some embodiments.

FIG. 4B is a diagram showing relative output angle direction for four-quadrant operation.

FIG. 4C is a table showing in-phase and quadrature control charge directions for up and down phase rotation.

DETAILED DESCRIPTION

Figure 1:
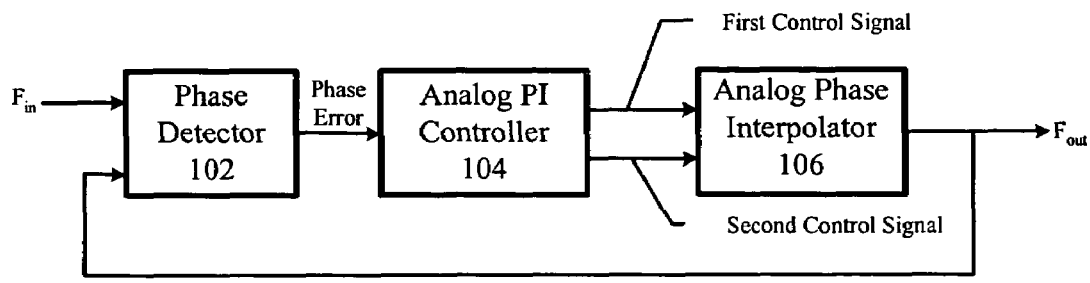
FIG. 1 is a block diagram of a PI-type phase control circuit in accordance with some embodiments.

With reference to FIG. 1, a block diagram of a phase interpolator (PI) type phase control circuit is shown. It generally comprises a phase detector 102 coupled to an analog PI controller 104, which in turn is coupled to an analog phase interpolator 106 to generate an output frequency signal ($Fo_{ut}$) having a phase that tracks the phase of an input frequency signal ($F_{in}$). The output signal ($F_{out}$) is fed back to the phase detector for closed loop phase tracking against the input frequency signal ($F_{in}$). The phase detector produces a phase error signal indicating the phase relationship between the input and output frequency signals (e.g., whether the phase of the fedback output signal leads or lags the input signal).

The PI controller 104 controls the phase of the output frequency signal based on the received phase error signal, i.e., it decreases (moves back or down) the output signal phase if it leads the input signal phase and increases (moves up or forward) the output signal phase if it lags the input signal phase. It uses the first and second control signals to control the output phase. Together, the first and second control signals identify a phase angle between 0 and 360 degrees. In some embodiments, because they are analog signals controlling an analog phase interpolator 106, high phase resolution may be achieved over the entire 360 degree range of operation. Depending on the particular phase interpolator being used, any suitable scheme (e.g., linear, sinusoidal) may be implemented for the control signals.

(It should be noted that the phase error signal may comprise one or more signals indicating whether the output frequency phase is ahead of or behind the input signal's phase. For example, it could comprise a single signal with its polarity indicating the phase relationship. Alternatively, as is the case below with reference to FIGS. 2, 3, 5, and 6, it could comprise first and second signals (e.g., signal pulses) indicating whether the output phase leads or lags the input phase depending on which of the first and second signals is asserted.)

Figure 2:
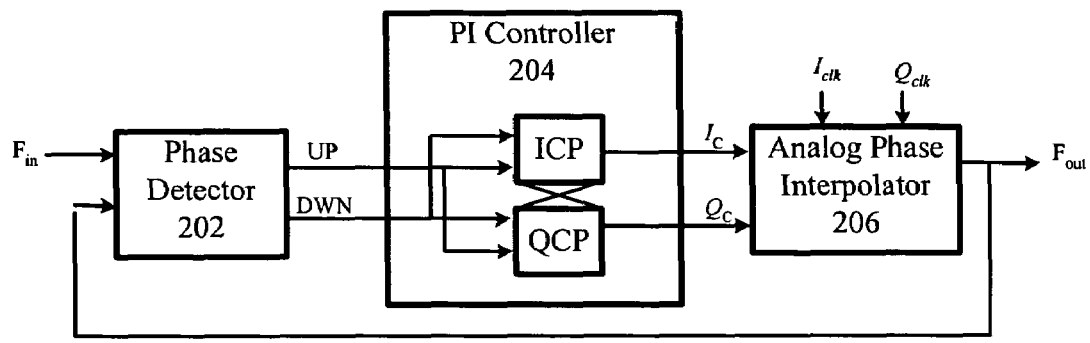
FIG. 2 is a block diagram of a PI-type phase control circuit in accordance with some embodiments of the phase control circuit of FIG. 1.

FIG. 2 shows a more detailed embodiment of a phase control circuit in accordance with some embodiments of the circuit of FIG. 1. It comprises a phase detector 202, analog PI controller 204, and an analog phase interpolator 206, all coupled together as indicated to generate the phase-controlled output frequency signal ($F_{out}$). The phase detector generates a phase error signal comprising UP and DWN phase direction signals indicating whether the output signal phase is behind or ahead of the input signal phase. In some embodiments, the UP signal asserts when the output phase lags the input phase, the DWN signal asserts when the output phase leads the input phase, and neither asserts when they are sufficiently equivalent.

The analog phase interpolator 206 uses applied in-phase and quadrature-phase reference clocks ($I_{clk}$, $Q_{clk}$) to generate the output frequency signal. The $I_{clk}$ and $Q_{clk}$ signals are 90° out of phase from one another but have equivalent frequencies which are near that of the input signal ($F_{in}$). The ideal relationship is that Fin and the frequencies of Iclk and Qclk are exactly equal, however this is not practical in many systems. The analog phase controller 204 comprises in-phase and quadrature-phase charge pump circuits (ICP, QCP) to generate in-phase ($I_C$) and quadrature-phase ($Q_C$) phase control signals in response to the UP and DWN signals from the phase detector 202. The $I_C$ and $Q_C$ signals are provided to the phase interpolator to essentially control the portions of the $I_{clk}$ and $Q_{clk}$ signals that make up the resultant output signal ($F_{out}$). As discussed further below, the ICP and QCP charge pump circuits are coupled to each other and have circuitry to appropriately charge or discharge their associated storage capacitance, depending on the quadrant location of the output phase angle, as well as the UP and DWN signals.

In some embodiments, the $I_{clk}$ and $Q_{clk}$ reference signals approximate triangle wave clocks. With triangle wave clocks, linearly weighted control values instead of, for example, the more common cosine-weighted values, may be employed.

With reference to FIG. 4A, a diagram indicating the linear relationship between the output phase angle (θ out) and the control values, $I_c$ and $Q_c$, is shown. As indicated, when the sum of the magnitudes of $I_C$ and $Q_C$ are maintained reasonably constant (k), full 360 degree phase control can be achieved using different value combinations of $I_C$ and $Q_C$, including both positive and negative values. With additional reference to FIG. 4B, the phase controller 204 thus controls the control values ($I_C$, $Q_C$) to adjust the output phase angle ($\theta$ out) to increase (counter-clockwise in depicted diagram) or decrease (clockwise in depicted diagram). By knowing the polarities of the control signals (as well as when they change), quadrant location of the output phase angle is known, and thus is also known whether the control ($I_C$, $Q_C$) magnitudes should increase or decrease when moving from one quadrant to the next. The table of 4C indicates appropriate charging directions for the $I_C$ and $Q_C$ phase control signals in FIG. 3.

Figure 3:
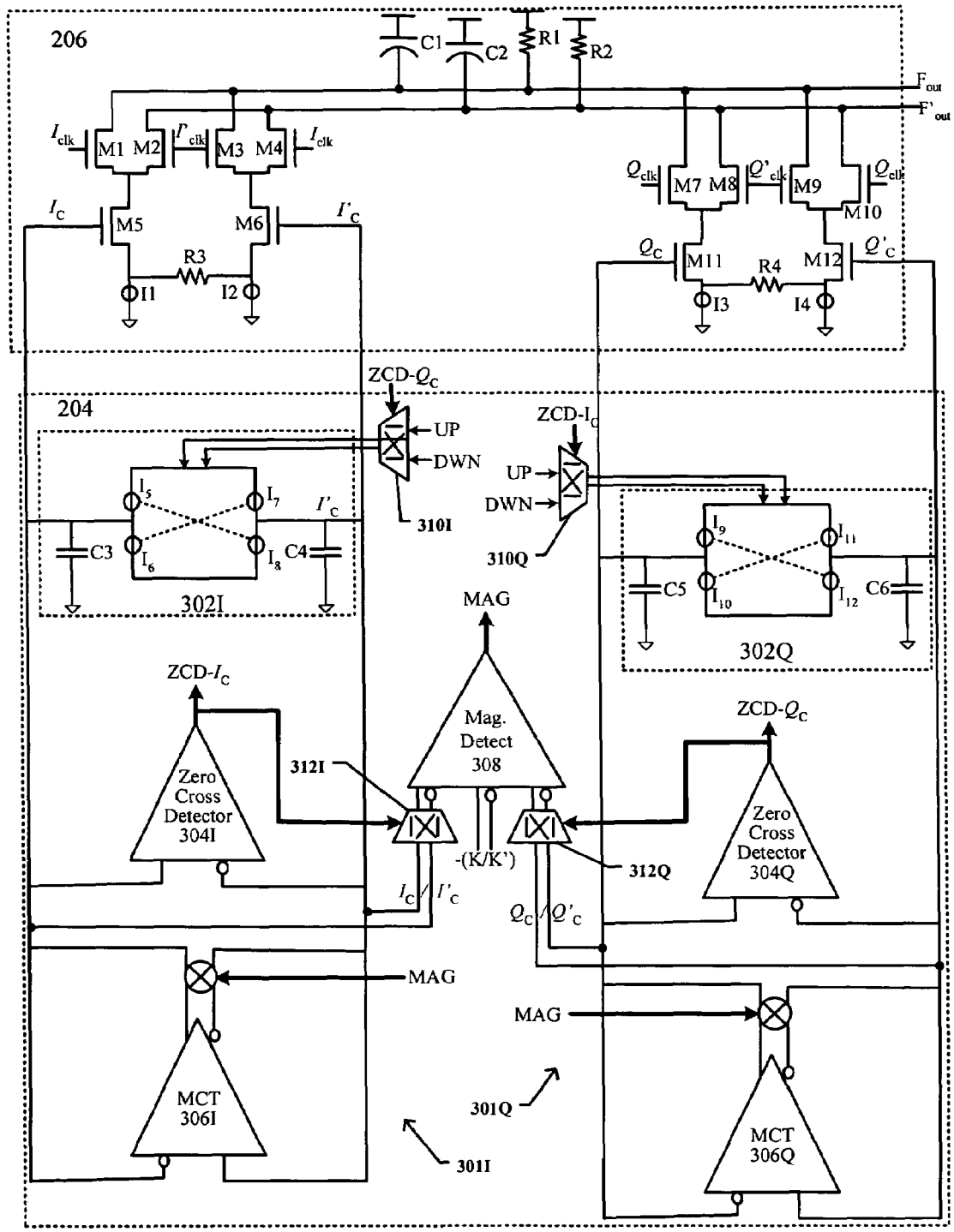
FIG. 3 is a schematic diagram of a phase interpolator with an analog controller in accordance with some embodiments of the circuits of FIGS. 2 and 1.

FIG. 3 shows a more detailed circuit embodiment of the analog phase controller 204 and analog phase interpolator 206 for the phase control circuit of FIG. 2. The PI controller 204 uses charge pump integrators to convert from the phase detector UP/DWN signals to the control signals ($I_C/I_C'$ and $Q_C/Q_C'$). It uses these control signals to control the phase of a differential output signal ($F_{out}/F'_{out}$) generated by the phase interpolator 206.

The phase interpolator 206 generally comprises differential in-phase (I) and quadrature-phase (Q) drivers coupled together at their outputs to provide the differential output frequency signal ($F_{out}/F'_{out}$). The I driver is formed from NMOS transistors M1 to M6, resistor R3, and current sources I1 and I2, coupled together as indicated. Similarly, the Q driver is formed from transistors M7 to M12, resistor R4, and current sources I3 and I4, coupled together as indicated. The I and Q drivers share filter capacitors C1, C2 and bias/pull-up resistors R1, R2 coupled between their differential output lines and supply power as shown.

(The term "NMOS transistor" refers to an N-type metal oxide semiconductor field effect transistor. Likewise, the term "PMOS transistor" refers to a P-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed.)

Transistors M5, M6, resistor R3 and current sources I1, I2 form a differential driver circuit with its differential input coupled to the in-phase control signal ($I_C/I'_C$) from the PI controller 204. The driver's output (at the drains of M5 and M6) is coupled to the output signal lines ($F_{out}/F'_{out}$) through transistors M1 to M4, which receive at their inputs the differential in-phase reference clock ($I_{clk}/I'_{clk}$) as indicated. Transistors M1 to M4 function as switches to essentially modulate the in-phase control signal ($I_C/I'_C$) onto the in-phase reference clock ($I_{clk}$). In this way, the amount of $I_{clk}$ contributing to the overall output frequency signal ($F_{out}/F'_{out}$) can be controlled by the value of the IC control signal ($I_C/I'_C$). The Q driver functions essentially the same way, except that instead of working with the in-phase (I) signals, it modulates the quadrature-phase control signal ($Q_C/Q'_C$) onto the quadrature-phase reference clock ($Q_{clk}/Q'_{clk}$). The resultant clocks are then combined and filtered at the output lines ($F_{out}/F'_{out}$) and provided as the output frequency signal.

The PI controller 204 comprises an in-phase (I) section 301I, a quadrature-phase (Q) section 301Q, and a magnitude detector circuit 308 with differential polarity switches 312I, 312Q, all coupled to one another as shown. Because the I and Q sections (301I, 301Q) are configured substantially the same and symmetrically aligned with one another, for the sake of brevity, only the I section 301I will be discussed in detail. Before addressing the I section 301I, however, the magnitude detector 308 will be addressed.

The magnitude detector 308 comprises an analog summing circuit with differential inputs. It receives as operands the $I_C/I'_C$ and $Q_C/Q'_C$ control signals coupled through diff. polarity switches 312I, Q, along with a negative K/K' value. It sums these values together to identify, pursuant to the constraint that the sum of the magnitudes of $I_C$ and $Q_C$ be constant, whether the sum of $I_C/I'_C$ and $Q_C/Q'_C$ is greater or less than K/K'. This is indicated by the MAG signal at its output.

The differential polarity switches 312I,Q are controlled by ZCD-$I_C$ and ZCD-$Q_C$ to ensure that the signs of $I_C/I'_C$ and $Q_C/Q'_C$ are correct, regardless of their quadrant location, to properly implement the summation. The MAG signal is provided to the magnitude correction transconductors (MCT) 306I,Q in the I and Q sections to control the magnitudes of $I_C/I'_C$ and $Q_C/Q'_C$ to substantially maintain their sum constant pursuant to the constraint.

The I section 301I comprises a charge pump circuit 302I, zero cross detector 304I, magnitude correction circuit 306I, and differential polarity switch 310I, all coupled together as shown.

The charge pump circuit 302I is formed from current sources/sinks I5 to I8 and integrating capacitors C3 and C4. Its differential output is coupled to the $I_C/I'_C$ signal. Depending on whether current source/sink I5/I8 or I6/I7 are turned on, it either charges or discharges, respectively, $I_C/I_C'$ so that it can range between a positive and negative value. (In some embodiments, it neither charges or discharges if both UP and DWN are inactive.) Capacitors C3 and C4 function as integrators, holding the charge and filtering noise from the $I_C/I'_C$ signal.

The UP and DWN signals are coupled to charge pump 302I through differential polarity switch 310I to control whether it charges, discharges or holds the $I_C/I'_C$ signal. (As used herein, a differential polarity switch comprises one or more multiplexers, or other suitable circuitry, to switch the polarities of one or more input differential signals as they are applied to an input of another circuit in response to a control signal.) The diff. polarity switch 310I, in response to applied control signal (ZCD-$Q_C$ from the Q section 301Q), controls the polarities of the UP and DWN signals as they are applied to the charge pump to generate the $I_C/I'_C$ signal in accordance with the table of FIG. 4C. The ZCD-$Q_C$ (from the Q section 301Q) signal is a digital signal indicating whether the $Q_C/Q'_C$ signal is positive or negative. Thus, it controls the charge pump 302I to appropriately charge or discharge based on the currently occupied quadrant. The table of FIG. 4C shows charging directions (charging up or charging down) for up and down angular rotations as indicated. (Note that the depicted signal lines may be single lines, or actually may comprise multiple lines such as with differential signals. In the depicted embodiment, the UP and DWN signals are differential signals but are represented with single lines for simplicity.)

The zero cross detector 304I comprises a suitably fast comparator or diff. amplifier with sufficiently low offset. Its inputs are coupled to the $I_C/I'_C$ signal to indicate at its output (ZCD-$I_C$) the sign of the $I_C/I'_C$ control signal. The ZCD-$Q_C$ signal is provided to the diff. polarity switch 310Q in the Q section 301Q to similarly control charge pump 302Q as the ZCD-IC signal controls charge pump 302I. The ZCD-$I_C$ signal is also provided to diff. control switch 312I to control the polarity of the $I_C/I'_C$ signal as it is applied to the magnitude correction detector 308.

The magnitude correction amplifier 306I controls the magnitude of the $I_C/I'_C$ value. It receives a digital control signal (MAG) from the magnitude detection circuit 308 indicating whether the sum of the $I_C$ and $Q_C$ magnitudes are too small or too large. Depending on the value of MAG, it either charges or discharges (increases or decreases the voltage difference across) the $I_C/I'_C$ signal in order to counter, for example, the effects of charge pump leakage, charge pump charge/discharge mismatch, or delay mismatches in the UP/DWN signal paths.

With the use of a negative feedback transconductor amplifier, the amount that $I_C/I'_C$ and $Q_C/Q'_C$ is altered is proportional to its present value thereby preventing the $I_C/I'_C$ value from being excessively changed too quickly. The magnitude control loop (taking into account the magnitude detector and both the I and Q magnitude correction transconductors) may dither about it's final settling point, but this should not affect the phase of the output signal ($F_{out}/F'_{out}$) since the sum of $I_C/I'_C$ and $Q_C/Q'_C$ is held substantially constant.

Again, the Q section 301Q is substantially the same as the I section 001I and symmetrically configured with respect to it. Of course, instead of generating the $I_C/I'_C$ signal, it generates the $Q_C/Q'_C$ control signal. Its magnitude correction circuit operates essentially the same as that from the I section except that it operates on the $Q_C/Q'_C$ signal rather than the $I_C/I'_C$ signal.

Accordingly, the phase controller 204 of FIG. 3 can generate $I_C$ and $Q_C$ control signals to effectively control the phase interpolator 206. It uses the UP and DWN signals as inputs to its charge pumps to generate the control signals, and it effectively controls the control signals in all quadrants by efficiently decoding quadrant location based on detected signs of the control signals themselves.

The phase control loops described up to this point constitute first order systems with a single integration stage (from the charge-pump capacitors) in the PI controller. Such first order systems can perform satisfactorily, especially when the input and reference clock frequencies are substantially equal to one another. (If they are not, it may still adequately operate, e.g., in a mode where it regularly transitions between quadrants, progressing around the quadrants and following the accumulated phase error that results from the frequency difference.) However, improved accuracy may be desired. Accordingly, the following sections introduce PI based phase control systems with second order PI controllers to track frequency offsets in order to obtain static phase errors approaching zero.

Figure 5:
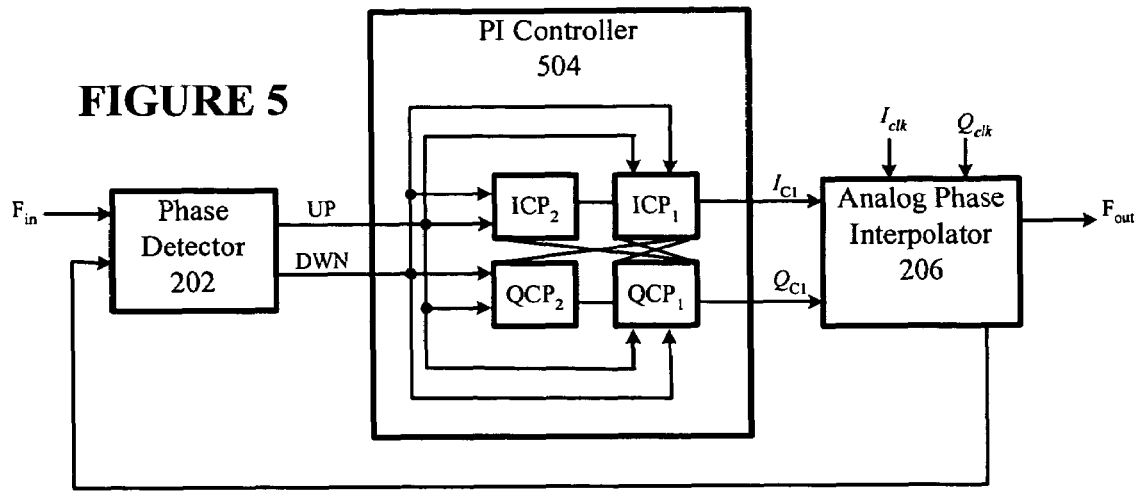
FIG. 5 is a diagram of a phase control circuit having a second order analog PI controller in accordance with some embodiments.

FIG. 5 shows a block diagram of a phase control circuit with second order integration. In the depicted embodiment, it comprises a phase detector 202 and phase interpolator 206 (as previously described), but it has a PI controller 504 with additional I and Q charge pump sections. They are combined with the first I and Q charge pump sections to provide for second order integration.

Figure 6:
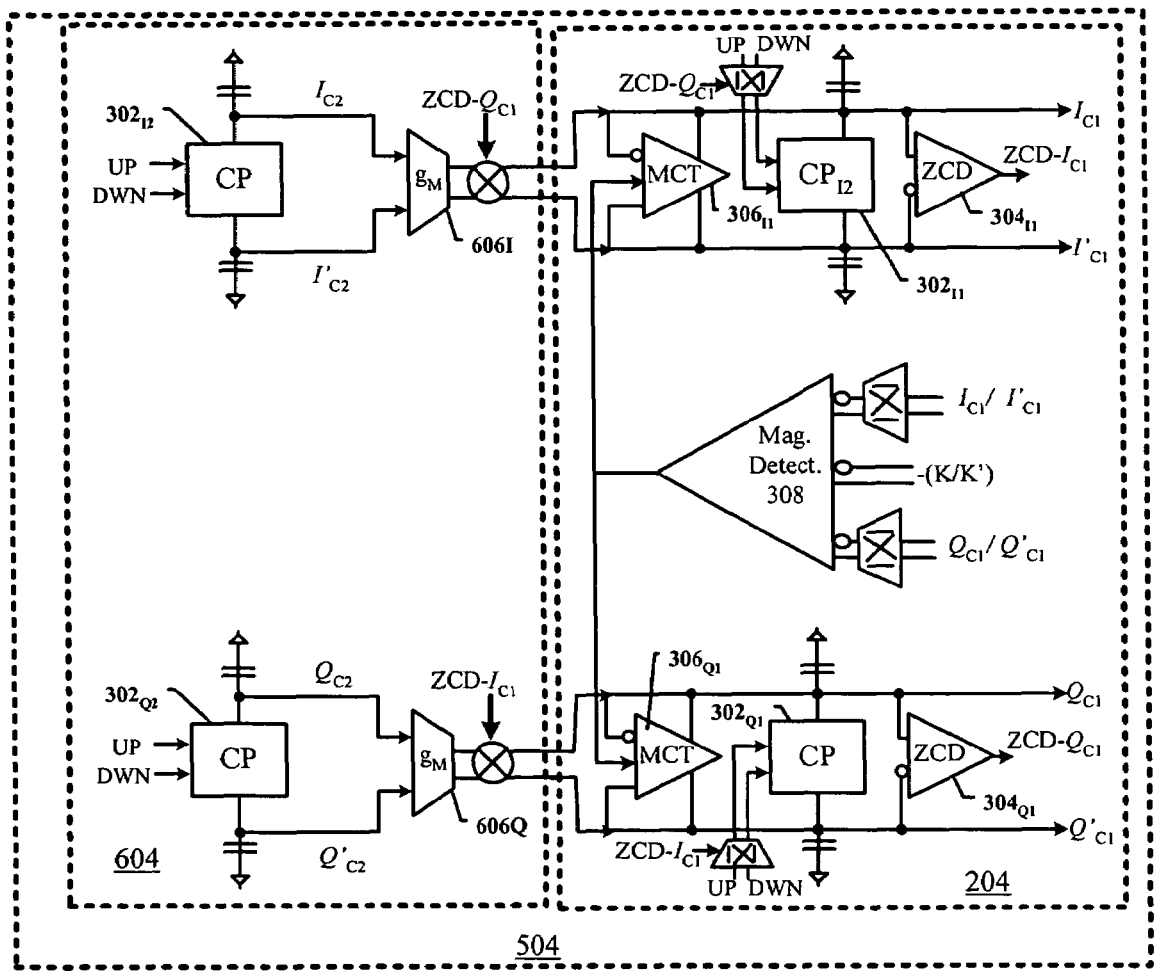
FIG. 6 is a diagram of an analog second order PI controller for the PI control circuit of FIG. 5 in accordance with some embodiments.

FIG. 6 shows a more detailed diagram of the PI controller 504 in accordance with some embodiments. It essentially comprises first and second PI control circuits 204 and 604. In the depicted embodiment, the first control circuit is implemented with a PI control circuit 204 such as is described with reference to FIGS. 2 and 3 (although this is not required). The second control circuit 604 is implemented with another PI control circuit such as 204 but without magnitude correction circuitry and separate zero cross detectors. In the depicted embodiment, it comprises charge pump circuits $302_{I2}$, $302_{Q2}$ coupled as shown to transconductor amplifiers 606I, 606Q, respectively. The transconductor amplifiers 606I,Q function to convert their integrated differential voltage signals ($I_{C2}/I'_{C2}$ and $Q_{C2}/Q'_{C2}$) into current signals that are fed into corresponding nodes ($I_{C1}/I'_{C1}$ and $Q_{C1}/Q'_{C1}$) of the first PI control circuit 204. (They may be implemented with transconductor amplifiers similar to or the same as transconductors 306 in the first PI control circuit 204.) With this configuration, the UP and DWN signals are coupled (without polarity control) to the charge pumps 302I, Q. Polarity (or quadrant location) control is achieved by controlling the transconductor amplifiers 606I,Q with the zero cross detection signals (ZCD-$Q_{C1}$, ZCD-$I_{C1}$ respectively) from the first phase control circuit.

The PI control circuits 204 and 604 basically function independently, each operating to integrate phase error through the UP and DWN phase error signals, except that the first control circuit 204 receives current from the second circuit 604, and the transconductor polarities in the second circuit are controlled by polarity control signals (ZCD-$Q_{C1}$, ZCD-$I_{C1}$) from the first control circuit 204. From a control systems standpoint, the first control circuit 204 serves as a proportional branch with the second circuit 604 functioning as an integral branch. Together, they provide for second order integration, which can result in zero (or near zero) static phase error even with a frequency offset between the input frequency and the reference clock frequencies.

Figure 7:
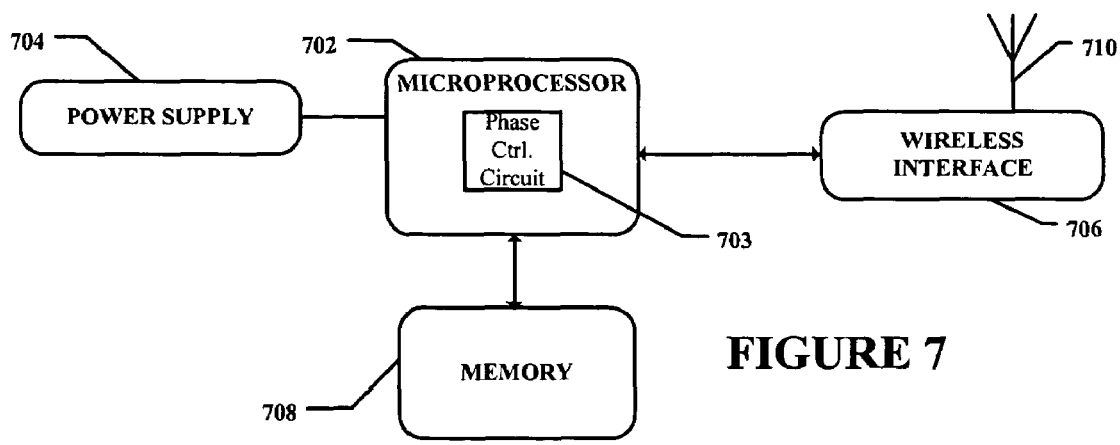
FIG. 7 is a block diagram of a computer system having a microprocessor with at least one phase control circuit in accordance with some embodiments.

With reference to FIG. 7, one example of a computer system is shown. The depicted system generally comprises a processor 702 that is coupled to a power supply 704, a wireless interface 706, and memory 708. It is coupled to the power supply 704 to receive from it power when in operation. The wireless interface 706 is coupled to an antenna 710 to communicatively link the processor through the wireless interface chip 706 to a wireless network (not shown). The microprocessor 702 comprises one or more phase control circuits 503 such as are disclosed herein for CDR and/or other applications.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
 a phase interpolator circuit to generate an output signal with a controllable phase;
 a control circuit coupled to the phase interpolator circuit to control the output signal phase with first and second control signals, the control circuit to control the first control signal based on the sign of the second control signal and to control the second control signal based on the sign of the first control signal; and
 the control circuit including an integrating circuit to provide it with at least second order integration.

2. The chip of claim 1, in which the control circuit comprises a first charge pump to generate the first control signal and a second charge pump to generate the second control signal.

3. The chip of claim 2, in which the first charge pump is coupled to a first phase direction signal from a phase detector and the second charge pump is coupled to a second phase direction signal from the phase detector.

4. The chip of claim 3, in which the first and second control signals are differential signals to be generated by differential first and second charge pumps, respectively.

5. The chip of claim 4, in which the first and second charge pumps comprise at least one integrating capacitor.

6. The chip of claim 3 in which the control circuit further comprises: a first zero crossing detector to detect the sign of the second control signal and to control the polarity of the coupled first phase direction signal based on the detected sign of the second control signal, and a second zero crossing detector to detect the sign of the first control signal and to control the polarity of the coupled second phase direction signal based on the detected sign of the first control signal.

7. The chip of claim 2, in which the first and second control signals each have an associated magnitude, wherein the sum of said magnitudes are controlled to be substantially equivalent to a constant value.

8. The chip of claim 7, further comprising a first magnitude control circuit coupled to the first charge pump to control the magnitude of the first control signal and a second magnitude control circuit coupled to the second charge pump to control the magnitude of the second control signal.

9. The chip of claim 8, in which the first and second magnitude control circuits comprise transconductor amplifiers.

10. The chip of claim 9, further comprising a magnitude detection circuit coupled to the first and second magnitude control circuits to control whether they charge or discharge their respective charge pump based on whether the sum of the first and second component magnitudes are below or above the constant value.

11. The chip of claim 2, in which the integrating circuit comprises a second control circuit to generate separate first and second control signals, the second control circuit to control the separate first control signal based on the sign of the second control signal from the first control circuit and to control the separate second control signal based on the sign of the first control signal from the first control circuit.

12. The chip of claim 11, in which the second control circuit comprises a first charge pump circuit coupled to a first transconductor amplifier to generate the separate first control signal and a second charge pump circuit coupled to a second transconductor amplifier to generate the separate second control signal.

13. The chip of claim 1, in which in-phase and quadrature phase clock reference signals are coupled to the phase interpolator, and the first and second control signals are in-phase and quadrature phase control signals.

14. A circuit, comprising:
 a phase detector circuit to receive an input frequency signal and an output frequency signal and to generate at least one phase error signal to indicate a phase relationship between said input and output frequency signals;
 a phase interpolator to generate the output frequency signal;
 a control circuit coupled to the phase interpolator and to the phase detector to control the phase of the output frequency signal based on the at least one phase error signal, the control circuit comprising first and second charge pumps coupled to the at least one phase error signal to generate first and second control signals coupled to the phase interpolator to control the phase of the output frequency signal, the first control signal based on the sign of the second control signal and the second control signal based on the sign of the first control signal; and
 the control circuit including an integrating circuit to provide second order integration.

15. The circuit of claim 14, in which the first charge pump is coupled to a first phase direction signal from the phase detector and the second charge pump is coupled to a second phase direction signal from the phase detector.

16. The circuit of claim 15, in which the first and second control signals are differential signals to be generated by differential first and second charge pumps, respectively.

17. The circuit of claim 15, in which the control circuit is to control the first control signal based on the sign of the second control signal and to control the second control signal based on the sign of the first control signal.

18. The circuit of claim 15 in which the control circuit further comprises:a first zero crossing detector to detect the sign of the second control signal and to control the polarity of the coupled first phase direction signal based on the detected sign of the second control signal, and a second zero crossing detector to detect the sign of the first control signal and to control the polarity of the coupled second phase direction signal based on the detected sign of the first control signal.

19. The circuit of claim 14, in which the first and second control signals each have an associated magnitude, wherein the sum of said magnitudes are controlled to be substantially equivalent to a constant value.

20. A system, comprising:
 (a) a microprocessor having one or more transceivers comprising at least one phase control circuit comprising:
  a phase interpolator circuit to generate an output signal with a controllable phase,
  a control circuit coupled to the phase interpolator circuit to control the output signal phase with first and second control signals, the control circuit to control the first control signal based on the sign of the second control signal and to control the second control signal based on the sign of the first control signal, and
  the control circuit including an integrating circuit to provide it second order integration;
 (b) an antenna; and
 (c) a wireless interface coupled to the microprocessor and to the antenna to communicatively link the microprocessor to a wireless network.

21. The system of claim 20, comprising a battery to supply power to the microprocessor.

* * * * *